(12) United States Patent
Givens

(10) Patent No.: US 6,781,235 B1
(45) Date of Patent: Aug. 24, 2004

(54) THREE-LEVEL UNITARY INTERCONNECT STRUCTURE

(75) Inventor: John H. Givens, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/565,135

(22) Filed: May 5, 2000

Related U.S. Application Data

(62) Division of application No. 08/801,819, filed on Feb. 14, 1997, now Pat. No. 6,060,385.

(51) Int. Cl.[7] ...................... H01L 23/48; H01L 21/4763
(52) U.S. Cl. ...................... 257/758; 257/635; 257/765; 257/773; 257/774; 438/622; 438/624; 438/629; 438/637
(58) Field of Search ........................ 257/758, 773–776, 257/762–766; 438/629, 637, 639, 640, 618, 619, 620, 622, 624

(56) References Cited

U.S. PATENT DOCUMENTS

| | | | | |
|---|---|---|---|---|
| 5,177,568 A | * | 1/1993 | Honma et al. | 257/295 |
| 5,739,068 A | * | 4/1998 | Jost et al. | 438/637 |
| 5,766,974 A | * | 6/1998 | Sardella et al. | 437/195 |
| 5,882,999 A | * | 3/1999 | Anderson et al. | 438/629 |
| 5,976,972 A | * | 11/1999 | Inohara et al. | 438/640 |

* cited by examiner

Primary Examiner—Steven Loke
Assistant Examiner—Donghee Kang
(74) Attorney, Agent, or Firm—Workman Nydegger

(57) ABSTRACT

An interconnect structure, which can have three-levels, is formed by a metallization method in an electrical circuit. The method comprises providing a substrate assembly and depositing thereon a first dielectric layer thereover. A second dielectric layer is then deposited over the first dielectric layer. The second dielectric layer is patterned and anisotropically etched to form contact corridors. The second dielectric layer is again patterned and etched to form trenches, some of which are immediately above the contact corridors. An electrically conductive material is deposited to fill the contact corridors and trenches, and to leave a portion of the electrically conductive material above the second dielectric layer and directly above both the contact corridors and the trenches. The deposition forms a unitary three-level interconnect having a contiguous trench below a contact corridor below a metal line, where the metal line is above the second dielectric layer. An optional antireflective coating can be deposited to assist in filling the trenches and contact corridor. Finally, patterning and etching of the electrically conductive material above the second dielectric layer forms metal lines for the electrical circuit.

33 Claims, 3 Drawing Sheets

THREE-LEVEL UNITARY INTERCONNECT STRUCTURE

BACKGROUND OF THE INVENTION

This application is a divisional application of U.S. patent application Ser. No. 08/801,819, filed on Feb. 14, 1997, now U.S. Pat. No. 6,060,385, which is incorporated herein by reference.

1. The Field of the Invention

The present invention relates to metallization methods in the manufacture of microelectronic semiconductor devices. More particularly the present invention relates to methods of making microelectronic semiconductor devices having up to three-level interconnect structures of conductive materials in which a single deposition process is used.

2. The Relevant Technology

After fabrication of microelectronic devices in and upon semi-conductive substrate assemblies, metallization of the circuitry is required to place the microelectronic devices in electrical communication one to another according to design. Prior art designs called for contacts, trenches, and superficial wires for metallization. These designs may require three or more separate depositions of conductive material in order to complete metallization of the design. Each layer of conductive material was made by the steps of depositing the conductive layer, depositing and patterning a photoresist or equivalent, and etching the conductive layer.

With multiple depositions of conductive material, usually composed of a metal or a doped polysilicon, various technical challenges and device characteristics arise. As semiconductor manufacturing advances from very large scale integration (VLSI) to ultra-large scale integration (ULSI), the devices on a semiconductor wafer shrink to sub-micron dimensions, and the circuit density increases to several million transistors per die. In order to accomplish the required high device packing density, progressively smaller feature sizes have been required. These reduced feature sizes include the width and spacing of interconnecting lines in the service geometry thereof, such as corners and edges.

As features become smaller, a process flow that requires multiple depositions tends to narrow the process window for error in misalignments. As such, a single misalignment in metallization can cause a significant yield reduction.

One technical obstacle in metallization line formation is depth-of-field limits in photolithography. Formation of metallization lines follows contact plug filling by deposition and patterning of a deposited metallization material. When a contact plug is formed in a contact hole, the metallization material that fills the contact hole may have an irregular surface immediately below the contact hole due to the filling thereof. The irregular surface of the metallization material has depth-of-field focusing problems due to a rough topography thereof. The rough topography can cause photolithographic steps to produce irregular metallization line widths, which in turn lead to unpredictable resistances along the metallization lines and unreliable device speeds.

Another technical obstacle is the inherent resistance in metal-to-metal interfaces between contacts and trenches, contacts and metallization lines, and trenches and metallization lines. This obstacle arises when disparate metals make up the contact and metallization line, or even when metals of the same composition are poorly interfaced. The process of forming contacts in semiconductors and the subsequent wiring of those contacts to form a completed integrated circuit conventionally comprises two steps.

The first step comprises forming an aluminum or tungsten plug within a contact hole by such methods as, for example, cold or hot deposition, cold-slow, or hot-fast force filling, or metal reflow of the contact hole. There are other methods of hole filling with aluminum known in the art. Tungsten plug hole filling comprises deposition of selected adhesional and barrier liner layers, followed by CVD of tungsten. The contact hole is usually defined within an insulation layer. Next, a planaizing step leaves the titanium or tungsten plug electrically isolated in the contact hole. The second deposition step comprises forming a metallization line over the plug, where the metallization line is usually composed of a material different from that of the plug.

The plug interface with the metallization line is problematic to electrical conduction because completely connected interface areas are difficult to achieve, particularly in dissimilar metals. Because resistance in electrical conduction is a function of cross-sectional area through the conductive body, a less than completely connected interface between contact or trench and metallization line causes a higher resistance than a completely connected interface. In addition to incomplete interface connections, filling a contact hole with aluminum requires high temperatures and pressures that may cause large or irregular grain structures to grow. Large or irregular grain structures resist flow and etchback, and do not conduct current as well as fine-grained structures.

Still other technical obstacles are electromigration and metal creep. These involve the transport of metal atoms along the direction of electron flow in the conductive lines, and can lead to failure of the conductive lines. These obstacles are discussed below in turn.

Aluminum-copper electromigration is well established in a structure with an aluminum-copper metallization line interfacing with a titanium or tungsten plug. The phenomenon occurs because copper diffusivity through titanium or tungsten is much lower than copper diffusivity through aluminum. Therefore, the copper is depleted from the area of the titanium or tungsten plug by the current flow, leading to failure at the interface between the titanium or tungsten plug and the aluminum-copper line.

Metal creep, on the other hand, occurs due to differences in the thermal coefficients of expansion between metals, insulators, and silicon materials. Differences in thermal coefficients of expansion can build up stresses in the metal interconnects, which can lead to migration of atoms from one area to another. This migration of atoms forms voids or vacancies in the metal interconnect which can cause an electrical failure.

The problems of cumulative misalignments and of electrical resistance at metal-metal interfaces with its several destructive effects, are to be avoided. What is needed is methods of making multi-level interconnect structures that overcome these problems.

SUMMARY OF THE INVENTION

The present invention comprises a method of forming a three-level interconnect metallization scheme for placing microelectronic devices in a circuit in electrical communication. The inventive method comprises forming a substrate assembly and depositing thereon a first dielectric layer. As used herein, a substrate assembly is one or more layers or structures upon a substrate. A second dielectric layer is then deposited over the first dielectric layer. The second dielectric layer is then patterned and etched twice. The first pattern and etch of the second dielectric layer is an anisotropic etch that forms contact corridors. By way of example, and not by way of limitation, a contact corridor can be a via. The second pattern and etch of the second dielectric layer forms one or more trenches. Preferably, one or more of the trenches will be formed directly above and contiguous to a corresponding contact corridor.

After trench formation, a filling step is performed. During the filling step, an electrically conductive material is deposited into the contact corridors and into the trenches so as to leave excess electrically conductive material above the contact corridors and trenches and upon the second dielectric layer. Additional steps, as a part of the filling step, may be taken to ensure a complete filling of the contact corridors and trenches. The excess electrically conductive material is situated directly above the contact corridors and trenches, thus forming a unitary integrated three-level interconnect.

After the single deposition step, but before the filling step, an optional antireflective coating is deposited to assist in a complete filling of the contact corridors and trenches. An optional planarization of the electrically conductive material can be carried out after the filling step.

After the filling step, either with or without the optional planarization of the electrical conductive material, a second optional antireflective coating is deposited to assist in reducing reflections that hinder subsequent photolithographic processing.

Finally, pattering and etching of the excess electrically conductive material is done. The remaining electrically conductive material in the contact corridors, the trenches, and above the second dielectric layer is formed into a single integral structure, the material of which is supplied to the substrate assembly in a single deposition step. The electrically conductive material in forming single integral structures in combinations of the contact corridors, trenches, and portions above the second dielectric layer each have a substantially constant electrical resistance from the top surface thereof to the bottom surface thereof. The substantially constant electrical resistance is due to the absence of metal-to-metal interfaces therein, which absence is inherent to the single deposition of the electrically conductive material.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to methods of making integrated three-level interconnect structures, two level interconnect structures, and one-level contacts in an integrated circuit, each said method using a single deposition of a conductive material for metallization of the integrated circuit.

Figure 1:
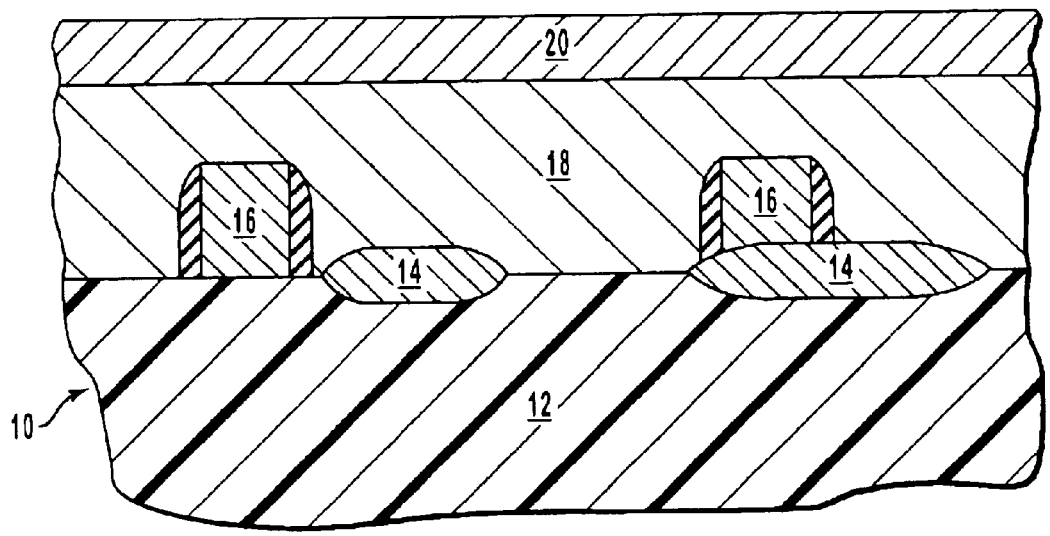
FIG. 1 is a cross-sectional view of a semiconductor device on a substrate assembly during fabrication in which typical structures have been fabricated within and upon a semiconductor substrate assembly.

FIG. 1 illustrates a semiconductor device 10. Semiconductor device 10 comprises, by way of non-limiting example, a substrate assembly 12 with active areas (not shown), oxide regions 14, gate structures 16, a first dielectric layer 18, and a second dielectric layer 20. Other structures, although not illustrated in FIG. 1, could also be a part of semiconductor device 10, including stacked or trench capacitors, as well as other structures.

The inventive method comprises depositing first dielectric layer 18 as shown in FIG. 1. To prevent silicon contamination, first dielectric layer 18 can optionally be composed of a material known to be a silicon impurity getterer such as a doped glass or the like.

If needed, first dielectric layer 18 can be planarized following the deposition thereof. Planarization techniques include chemical-mechanical planarization (CMP), mechanical planarization (MP), dry etchback, other isotropic etching, reflow, and the like depending upon the nature of first dielectric layer 18. The purpose of such a planarizing step is to provide a relatively flat surface upon which second dielectric layer 20 will be formed. First and second dielectric layers 18, 20 will preferably have different compositions so as to allow the patterning of second dielectric layer 20 with selective etching of first dielectric layer 18, as is described below.

Planarization, although often a necessary step, may be omitted for either or both the first and the second dielectric layers after the deposition thereof. Omission of a planarizing step is possible where the topography of substrate assembly 12 so permits, or where as-deposited first and/or dielectric layers 18, 20 are sufficiently fluid so as to not require a planarization step.

After the deposition and optional planarizing of first dielectric layer 18, second dielectric layer 20 is deposited and may also be optionally planarized if needs be. Deposition of second dielectric layer 20 can be a deposition process that includes silicon dioxide formed by tetraethyl ortho silicate (TEOS), nitride, boron-phosphorus silicate glass (BPSG), and the like according to the specific application.

Figure 2:
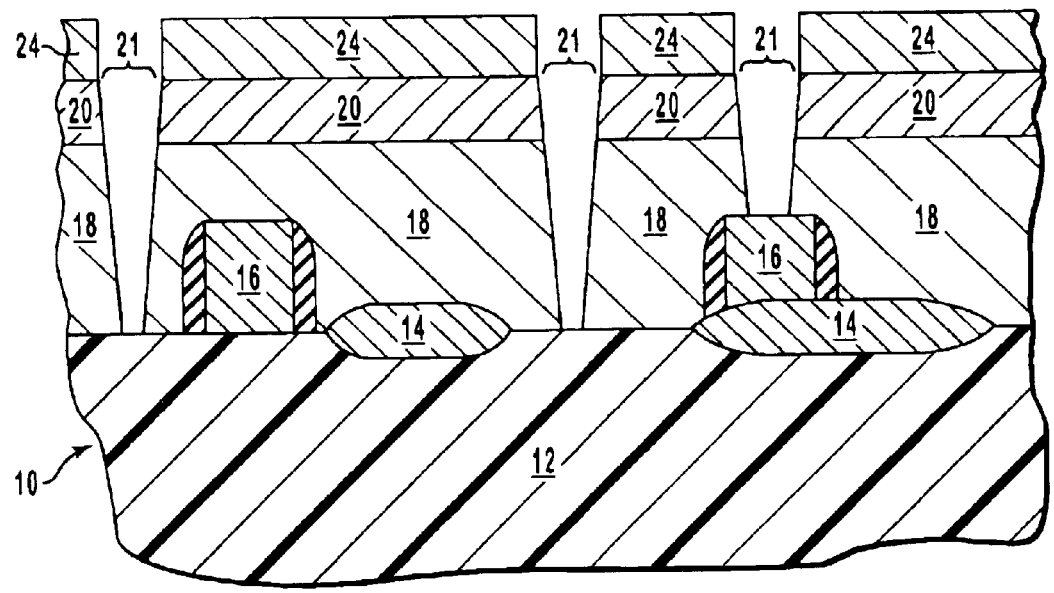
FIG. 2 is a cross-sectional view of the semiconductor device as seen in FIG. 1 and illustrates contact hole fabrication.

Second dielectric layer 20 is then patterned with a first mask 24 and anisotropically etched to form contact corridors 21 which extend through first and second dielectric layers, 18, 20. Contact corridors 21 are illustrated in FIG. 2. Depending upon the application, contact corridors 21 can be used to expose an active area (not shown) of substrate assembly 12, the top of gate structure 16, and regions between the bottom of contact corridors 21 and substrate assembly 12.

Figure 3:
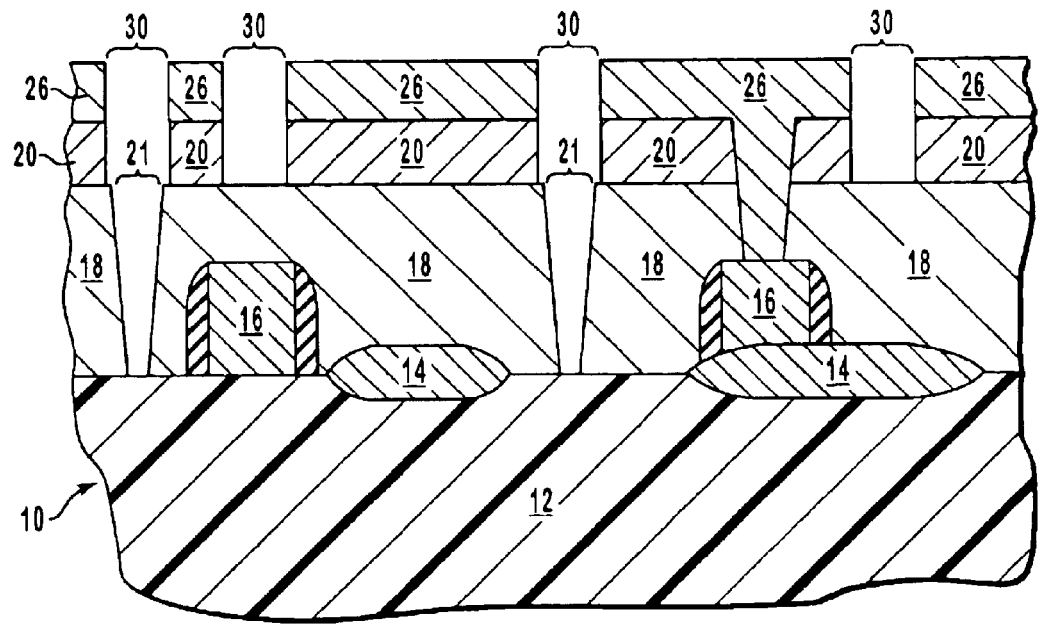
FIG. 3 is a cross-sectional view of the semiconductor device as seen in FIG. 2 is and illustrates trench formation in an upper dielectric layer of the semiconductor device.

Following the formation of contact corridors 21, trenches 30 are formed. To form trenches 30, a second mask 26 is used to pattern second dielectric layer 20. Second mask 26 is designed to situate one or more trenches 30 above one or more contact corridors 21, and to situate one or more trenches 30 above first dielectric layer 18. FIG. 3 illustrates the result of an etch with the pattern from second mask 26, which result includes both trenches 30 and contact corridors 21.

In forming trenches 30, the etch recipe used in the etch step can be selective to first dielectric layer 18 and substantially unselective to second dielectric layer 20. Alternatively, it may be desirable to provide a etch recipe that etches first dielectric layer 18 faster so as to reshape contact corridors 21, if so desired. As such, applications are contemplated in which the second etch step has an etch recipe that is partially selective to first dielectric layer 18 and less selective to second dielectric layer 20. As such, trenches 30 are formed, while contact corridors 21 are changed as to the dimensions from the first etch step described above.

Figure 4:
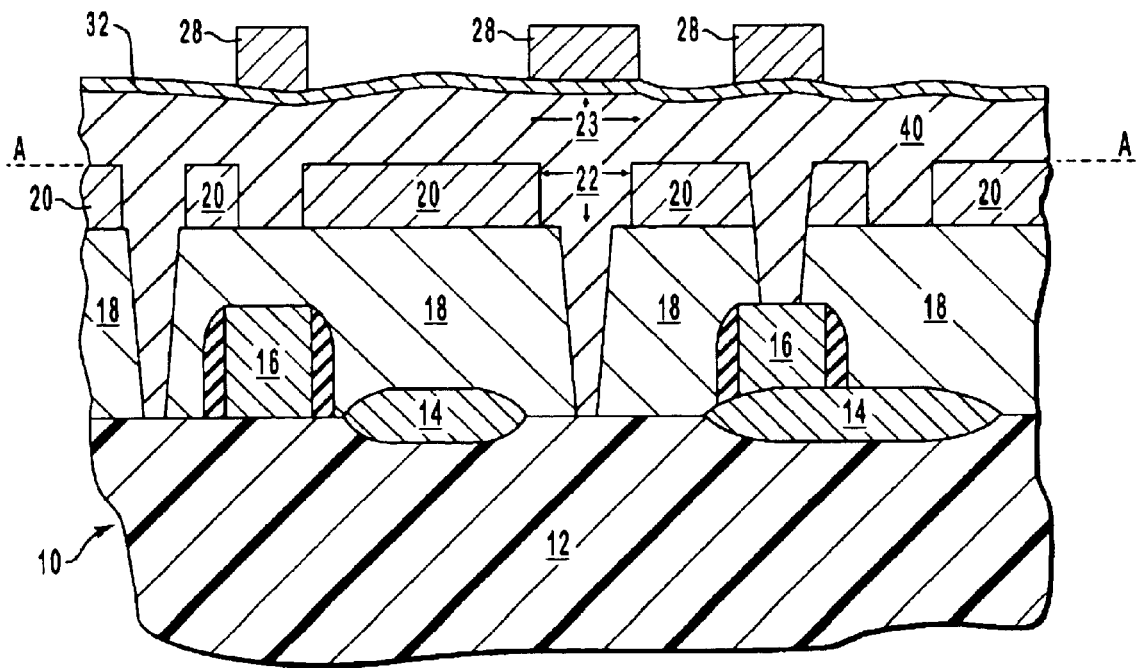
FIG. 4 is a cross-sectional view of the semiconductor device as seen in FIG. 3 and illustrates formation of a metallization layer

After trenches 30 are formed, first and second masks 24, 26 are stripped, and an electrically conductive material 40 is deposited as shown in FIG. 4. Electrically conductive material 40 can be composed of doped polysilicon, aluminum and aluminum alloys of AlCu, AlSi, AlSiCu, AlTi their combinations, and equivalents. Other aluminum alloys that are contemplated as consistent with the present invention comprise AlAg, AlAu, AlMn, AlGe, AlW, AlCuGe, AlNi their combinations, and equivalents.

After initial deposition of electrically conductive material 40, an optional antireflective coating 32, illustrated in FIG. 4, is deposited. Antireflective coating 32 is useful as an etching assistant for subsequent patterning and etching of electrically-conductive material 40 to form metal lines therefrom. The antireflective quality of antireflective coating 32 benefits subsequent photolithographic steps in patterning electrically conductive material 40 by reducing image scattering or blurring inherent in the reflective nature of electrically conductive material 40. Antireflective coating 32 is also useful as an energy-absorbing layer which maintains an elevated temperature of electrically conductive material 40 while the same fills voids within trenches 30 and contact corridors 21. Examples of antireflective coatings include organic layers, SiN and equivalents.

Electrically conductive material 40 is deposited within trenches 30 and contact corridors 21 by known deposition methods such as physical vapor deposition (PVD), hot PVD, high density plasma physical vapor deposition (HDPPVD), and chemical vapor deposition (CVD). Complete filling of trenches 30 and of contact corridors 21 may be accomplished by such additional processing, where necessary or desired, as reflow, high pressure fill, their combinations, and the like. As seen in FIG. 4, electrically conductive material 40 has two regions which are generally indicated as an embedded metallization region 22 and a superficial metallization region 23. Embedded metallization region 22 is defined as a portion of electrically-conductive material 40 below an upper surface of second dielectric layer 20. As seen in FIG. 4, embedded metallization region 22 is depicted as being below a line A—A. As such, embedded metallization region 22 is that portion of electrically conductive material 40 that fills trenches 30 and contact corridors 21. Superficial metallization region 23 is defined as that portion of electrically conductive material 40 above the upper surface of second dielectric layer 20. As seen in FIG. 4, superficial metallization region 23 is depicted as being above the line A—A.

Following the deposition of electrically conductive material 40, and optionally filling steps described above, electrically conductive material 40 may then be planarized so as to form a planar surface upon superficial metallization region 23. This optional planarization aids subsequent photolithography processing of electrically conductive material 40 incident to the patterning thereof which is necessary for etching metal lines therefrom As described above, it is desireable to pattern a planar surface so as to prevent the formation of metal lines of varying widths due to improper photolithography. This optional planarization can be followed by a second optional antireflective coating deposition, resulting in a substantially planar layer similar to antireflective coating 32 seen in FIG. 4, which assists as described above in improving the accuracy of patterning second dielectric layer 20 during photolithography processing.

Second dielectric layer 20 is patterned with a third mask 28, as seen in illustrated in FIG. 4. An etch of second dielectric layer 20 through third mask 28 forms metal lines having a shape and orientation according to a design for an electrical circuit metallization scheme. A trench-contact structure 25 is formed as an integral combination within contact corridor 21 and trench 30. A wire-trench structure 27 is formed as an integral combination of superficial metallization region 23 and contact corridor 21. A wire-trench-contact structure 29, seen in FIG. 6, is formed as an integral combination of superficial metallization region 23, trench 30, and contact corridor 21. A wire-contact structure 31 is formed as an integral combination of superficial metallization region 23 and contact corridor 21. Finally, a trench structure 33 is illustrated where a portion of superficial metallization region 23 seen in FIG. 4 was removed to result in trench structure 33 seen in FIG. 5. As such, FIG. 5 illustrates the result of the inventive method in which four interconnect structures are depicted.

Figure 5:
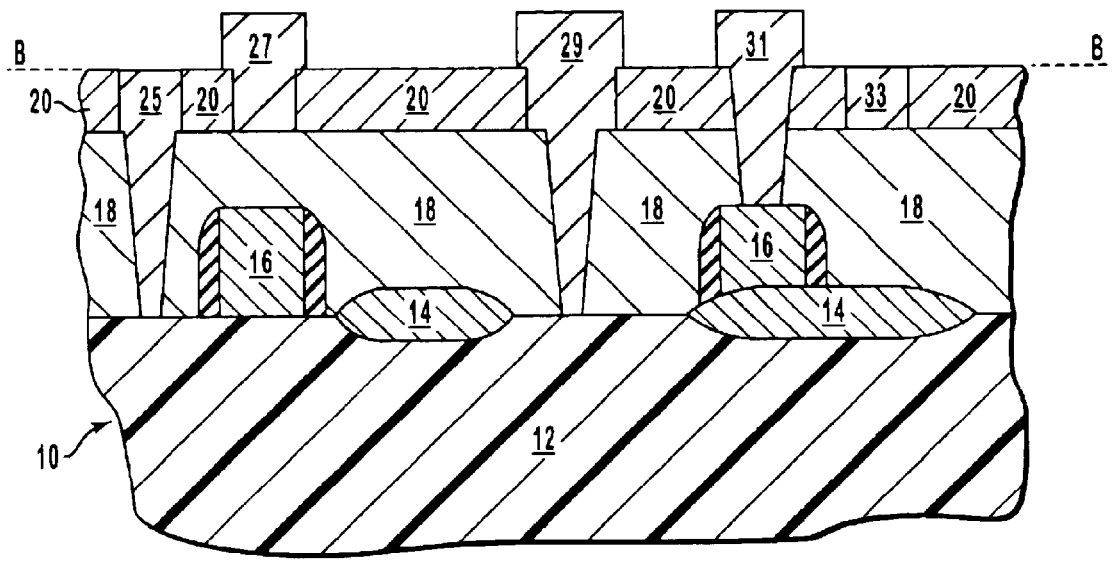
FIG. 5 is a cross-sectional view of the semiconductor device as seen in FIG. 4 and illustrates the metallization thereof, wherein circuitry having several interconnect features has been completed with a single deposition and, patterning of a conductive material.
Figure 6:
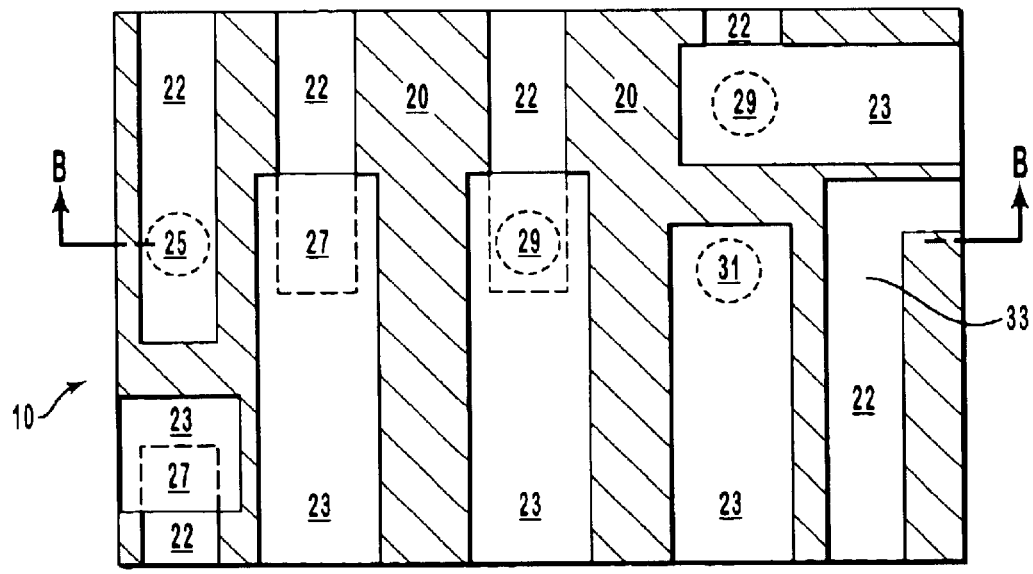
FIG. 6 illustrates a plan view of the semiconductor device of FIG. 5 in which wiring, trenches, and contacts are depicted.

Although semiconductor device 10 is depicted in FIG. 5 as cross-sectional, it is also illustrative to understand the method and structures of the present invention by viewing semiconductor device 10 from the plan view of FIG. 6. In FIG. 6, which is taken along a line B—B within second dielectric layer 20 of FIG. 5, trench-contact structure 25, wire-trench structure 27, wire-trench-contact structure 29, wire-contact structure 31, and trench 33 are illustrated.

As stated above, "metal-to-metal interfaces" are problematic in electrical circuits due to inherent resistance increases therein. Metal-to-metal interfaces are known in multiple depositions required for metallization of circuits having contacts or vias, trenches, and superficial wiring. This metallization includes such structures as bus bars, cables, bonding pads and the like. The inventive method, however, accomplishes metallization of an electrical circuit in a single deposition step. As such, the problem known to multiple level interconnects as "metal-to-metal interfaces" is substantially eliminated. The inventive method also accomplishes a three levels metallization without intervening metal-to-metal interfaces. The substantial elimination of metal-to-metal interfaces in metallization also reduces a tendency for metal migration in that there is an absence of inadequately connected interfacial areas that cause higher temperatures and metal migration. The specific resistance, defined as the resistance per a given cross-sectional area, is substantially uniform throughout single and multiple level interconnect structures.

The present invention may be embodied in other specific forms without departing from its spirit or essential characteristics. The described embodiments are to be considered in all respects only as illustrated and not restrictive. The scope of the invention is, therefore, indicated by the appended claim and their combination in whole or in part rather than by the foregoing description. All changes that come within the meaning and range of equivalency of the claims are to be embraced within their scope.

What is claimed is:

1. An interconnect structure comprising:
   a first dielectric layer upon a substrate assembly, said first dielectric layer defining a first contact corridor configured to provide electrical interconnection at a first level of the interconnect structure;
   a second dielectric layer upon said first dielectric layer and having an upper surface, said second dielectric layer defining a first trench extending substantially parallel to an upper surface of the second dielectric layer, said first trench extending laterally through at least a portion of the second dielectric layer away from the first contact corridor, the first trench configured to provide electrical interconnection at a second level of the interconnect structure; and
   a first metal layer extending from a top surface above the second dielectric layer through said first trench an terminating at a bottom surface thereof within said first contact corridor, said first metal layer substantially filling said first trench and said first contact corridor, said first metal layer having a first portion thereof extending from the first trench and above the second dielectric layer, the first portion configured to provide electrical interconnection at a third level of the interconnect structure, said first metal layer having a substantially constant electrical resistance from the top surface thereof to the bottom surface thereof within said first contact corridor.

2. The interconnect structure as defined in claim 1, wherein the first metal layer is a unitary structure free of metal-to-metal interfaces between the top surface thereof and the bottom surface thereof.

3. The interconnect structure as defined in claim 1, wherein the first dielectric layer is substantially composed of a material that is dissimilar from a material from which said second dielectric layer is substantially composed.

4. The interconnect structure as defined in claim 1, further comprising a gate structure situated on said substrate assembly, wherein said first contact corridor terminates at a gate surface upon said gate structure, said bottom surface of said first metal layer being in contact with said gate surface.

5. The interconnect structure as defined in claim 1, wherein the bottom surface of said first metal layer is situated upon said substrate assembly.

6. The interconnect structure as defined in claim 1, further comprising:
   a second contact corridor defined by said first dielectric layer;
   a second trench defined by said second dielectric layer; and
   a second metal layer extending from a top surface substantially not above the second dielectric layer, through said second trench, and terminating at a bottom surface thereof within said second contact corridor, said second metal layer substantially filling said second trench and said second contact corridor, said second metal layer having a substantially constant electrical resistance from the top surface thereof to the bottom surface thereof within said second contact corridor.

7. The interconnect structure as defined in claim 6, wherein the bottom surface of each said first and second metal layers is situated upon said substrate assembly.

8. The interconnect structure as defined in claim 6, wherein said first and second metal layers are substantially composed of a material selected from the group consisting of doped polysilicon, W, aluminum alloys, AlCu, AlSi, AlSiCu, AlTi, AlAg, AlAu, AlMn, AlGe, AlW, AlCuGe, AlNi, and their combinations.

9. The interconnect structure as defined in claim 6, further comprising:
   a third trench defined by said second dielectric layer; and
   a third metal layer extending from a top surface substantially not above the second dielectric layer, through said third trench, and terminating at a bottom surface thereof upon a top surface of said first dielectric layer, said third metal layer substantially filling said third trench, said third metal layer having a substantially constant electrical resistance from the top surface thereof to the bottom surface thereof upon said first dielectric layer.

10. An interconnect structure comprising:
    a first dielectric layer upon a substrate assembly, said first dielectric layer defining a first contact corridor and configured to provide electrical interconnection at a first level of the interconnect structure;
    a second dielectric layer upon said first dielectric layer and having an upper surface, said first dielectric layer being substantially composed of a material that is dissimilar from a material from which said second dielectric layer is substantially composed, said second dielectric layer defining a first trench extending substantially parallel to an upper surface of the second dielectric layer, said first trench extending laterally through at least a portion of the second dielectric layer away from the first contact corridor, the first trench configured to provide electrical interconnection at a second level of the interconnect structure;
    a first metal layer extending from a first top surface above the second dielectric layer, through said trench, and terminating at a bottom surface thereof within said contact corridor, said first metal layer substantially filling said first trench and said first contact corridor, said first metal layer having a first portion thereof extending from the first trench and above the second dielectric layer, the first portion configured to provide electrical interconnection at a third level of the interconnect structure, said first metal layer having a substantially constant electrical resistance from the top surface thereof to the bottom surface thereof within said contact corridor;
    a gate structure situated on said substrate assembly, wherein said first contact corridor terminates at a gate surface upon said gate structure, said bottom surface of said first metal layer being in contact with said gate surface;
    a second contact corridor defined by said first dielectric layer;
    a second trench extending substantially parallel to an upper surface of the second dielectric layer and defined by said second dielectric layer;
    a second metal layer extending from a top surface substantially not above the second dielectric layer, through said second trench, and terminating at a bottom surface thereof within said second contact corridor, said second metal layer substantially filling said second trench and said second contact corridor, said second metal layer having a substantially constant electrical resistance from the top surface thereof to the bottom surface thereof within said contact corridor upon said substrate assembly;

a third trench extending substantially parallel to an upper surface of the second dielectric layer and defined by said second dielectric layer; and a third metal layer extending from a top surface substantially not above the second dielectric layer, through said third trench, and terminating at a bottom surface thereof upon a top surface of said first dielectric layer, said third metal layer substantially filling said third trench, said third metal layer having a substantially constant electrical resistance from the top surface thereof to the bottom surface thereof upon said first dielectric layer, wherein said first, second, and third metal layers are substantially composed of a material selected from the group consisting of doped polysilicon, W, aluminum alloys, AlCu, AlSi, AlSiCu, AlTi, AlAg, AlAu, AlMn, AlGe, AlW, AlCuGe, AlNi, and combinations thereof.

11. The interconnect structure as defined in claim 10, wherein the first dielectric layer has a substantially planar surface upon which said second dielectric layer is formed, and said upper surface of the second dielectric layer is substantially planar.

12. An interconnect structure comprising:
a first dielectric layer upon a substrate assembly;
a second dielectric layer upon said first dielectric layer and having a planarized top surface thereon;
a first recess extending through said second dielectric layer and into said first dielectric layer;
a second recess extending through said first recess and into said second dielectric layer, said second recess having a first trench extending substantially parallel to an upper surface of the second dielectric layer and defined by said second dielectric layer, and a first contact corridor configured to provide electrical interconnection at a first level within the first dielectric layer, said first trench extending laterally through at least a portion of the second dielectric layer away from the first contact corridor, the first trench configured to provide electrical interconnection at a second level within the second dielectric layer; and
a first metal layer that is upon said planarized top surface of said second dielectric layer, said first metal layer filling said first contact corridor and said first trench, said first metal layer extending from a top surface above the second dielectric layer through said first trench and terminating at a bottom surface thereof within said first contact corridor, said first metal layer having a first portion thereof extending from the first trench and above the second dielectric layer, the first portion configured to provide electrical interconnection at a third level above the second dielectric layer.

13. The interconnect structure as defined in claim 12, wherein said first metal layer has a constant electrical resistance from the top surface thereof to the bottom surface thereof.

14. An interconnect structure comprising:
a first dielectric layer upon a silicon surface of a substrate assembly, said first dielectric layer being composed of a material having a silicon impurity getterer property;
a second dielectric layer upon said first dielectric layer;
a first recess extending through said second dielectric layer and into said first dielectric layer;
a second recess extending through said first recess and into said second dielectric layer, said second recess having a first trench extending substantially parallel to an upper surface of the second dielectric layer and defined by said second dielectric layer, and a first contact corridor defined by said first dielectric layer, said first contact corridor configured to provide electrical interconnection at a first level within the first dielectric layer, said first trench extending laterally through at least a portion of the second dielectric layer away from the first contact corridor, the first trench configured to provide electrical interconnection at a second level within the second dielectric layer; and
a first metal layer that:
fills both the first contact corridor and the first trench;
extends from a top surface above the second dielectric layer through said first trench and terminates at a bottom surface thereof within said first contact corridor; and
has a first portion that extends from the first trench and above the second dielectric layer, the first portion configured to provide electrical interconnection at a third level above the second dielectric layer.

15. The interconnect structure as defined in claim 14, wherein the first metal layer has a constant electrical resistance from the top surface thereof to the bottom surface thereof.

16. An interconnect structure comprising:
a first dielectric layer upon a substrate assembly;
a second dielectric layer upon said first dielectric layer;
a first recess extending through said second dielectric layer and into said first dielectric layer;
a second recess extending through said first recess and into said second dielectric layer, said second recess having a first trench extending substantially parallel to an upper surface of the second dielectric layer and defined by said second dielectric layer, and a first contact corridor defined by said first dielectric layer, said first contact corridor configured to provide electrical interconnection at a first level within the first dielectric layer, said first trench extending laterally through at least a portion of the second dielectric layer away from the first contact corridor, the first trench configured to provide electrical interconnection at a second level within the second dielectric layer; and
a first metal layer that:
fills both the first contact corridor and the first trench;
extends from a top surface above the second dielectric layer through said first trench and terminates at a bottom surface thereof within said first contact corridor;
has a first portion that extends from the first trench and above the second dielectric layer, the first portion configured to provide electrical interconnection at a third level above the second dielectric layer; and
is a unitary structure free of metal-to-metal interfaces between the top surface thereof and the bottom surface thereof.

17. The interconnect structure as defined in claim 16, wherein said first metal layer has a constant electrical resistance from the top surface thereof to the bottom surface thereof.

18. An interconnect structure comprising:
a first dielectric layer upon a substrate assembly;
a second dielectric layer upon said first dielectric layer;
a first recess extending through said second dielectric layer and into said first dielectric layer;
a second recess extending through said first recess and into said second dielectric layer, said second recess having a first trench extending substantially parallel to an upper surface of the second dielectric layer and defined by said second dielectric layer, and a first contact corridor defined by said first dielectric layer, said first contact corridor configured to provide electrical interconnection at a first level within the first dielectric layer, said first trench extending laterally through at least a portion of the second dielectric layer away from the first contact corridor, the first trench configured to provide electrical interconnection at a second level within the second dielectric layer;
a first metal layer that:
fills both the first contact corridor and said first trench;
extends from a top surface above the second dielectric layer through the first trench and terminates at a bottom surface thereof within said first contact corridor; and
has a first portion that extends from the first trench and above the second dielectric layer, the first portion configured to provide electrical interconnection at a third level above the second dielectric layer;
a third recess extending through said second dielectric layer and into said first dielectric layer;
a fourth recess extending through said third recess and into said second dielectric layer, said fourth recess having a second trench extending substantially parallel to an upper surface of the second dielectric layer and defined by said second dielectric layer, and a second contact corridor defined by said first dielectric layer; and
a second metal layer that:
is in both the second contact corridor and the second trench; and
extends from a top surface not above the second dielectric layer, through said second trench, and terminates at a bottom surface thereof within said second contact corridor.

19. The interconnect structure as defined in claim 18, wherein said second metal layer has a constant electrical resistance from the top surface thereof to the bottom surface thereof.

20. An interconnect structure comprising:
a first dielectric layer upon a substrate assembly;
a second dielectric layer upon said first dielectric layer;
a first recess extending through said second dielectric layer and into said first dielectric layer;
a second recess extending through said first recess and into said second dielectric layer, said second recess having a first trench extending substantially parallel to an upper surface of the second dielectric layer and defined by said second dielectric layer, and a first contact corridor defined by said first dielectric layer, said first contact corridor configured to provide electrical interconnection at a first level within the first dielectric layer, said first trench extending laterally through at least a portion of the second dielectric layer away from the first contact corridor, the first trench configured to provide electrical interconnection at a second level within the second dielectric layer; and
a first metal layer that:
fills both the first contact corridor and the first trench;
extends from a top surface above the second dielectric layer through said first trench and terminates at a bottom surface thereof within the first contact corridor; and
has a first portion that extends from the first trench and above the second dielectric layer, the first portion configured to provide electrical interconnection at a third level above the second dielectric layer, wherein the first dielectric layer is composed of a material that is dissimilar from a material from which the second dielectric layer is composed.

21. The interconnect structure as defined in claim 20, wherein the top surface on the first portion of the first metal layer is planarized and has thereon an antireflective coating.

22. The interconnect structure as defined in claim 20, wherein said first metal layer is composed of a material selected from the group consisting of doped polysilicon, W, aluminum alloys, AlCu, AlSi, AlSiCu, AlTi, AlAg, AlAu, AlMn, AlGe, AlW, AlCuGe, AlNi, and their combinations.

23. The interconnect structure as defined in claim 20, wherein said first metal layer has a constant electrical resistance from the top surface thereof to the bottom surface thereof.

24. The interconnect structure as defined in claim 20, wherein:
a top surface of the first dielectric layer is planar; and
the second dielectric layer is formed upon the planar top surface of the first dielectric layer.

25. The interconnect structure as defined in claim 20, wherein:
a top surface of the second dielectric layer is planar; and
the first metal layer is upon the planar top surface of the second dielectric layer.

26. The interconnect structure as defined in claim 20, wherein said first dielectric layer is formed upon a silicon surface of said substrate assembly, said first dielectric layer being composed of a material having a silicon impurity getterer property.

27. The interconnect structure as defined in claim 20, wherein the first metal layer is a unitary structure free of metal-to-metal interfaces between the top surface thereof and the bottom surface thereof.

28. The interconnect structure as defined in claim 20, wherein:
the substrate assembly comprises a gate structure;
the first contact corridor terminates at a gate surface upon said gate structure; and
the bottom surface of the first metal layer is in contact with said gate surface.

29. The interconnect structure as defined in claim 20, wherein the bottom surface of said first metal layer is situated upon said substrate assembly.

30. The interconnect structure as defined in claim 20, further comprising:
a third recess extending through said first dielectric layer and into said second dielectric layer;
a fourth recess extending through said second recess and into said second dielectric layer, said fourth recess having a second trench defined by said second dielectric layer and a second contact corridor defined by said first dielectric layer; and
a second metal layer that:
fills the second contact corridor and said second trench;
extends from a top surface not above the second dielectric layer, through said second trench, and terminates at a bottom surface thereof within said second contact corridor; and
has a constant electrical resistance from the top surface thereof to the bottom surface thereof.

31. The interconnect structure as defined in claim 30, wherein the bottom surface of each said first and second metal layers is situated upon said substrate assembly.

32. The interconnect structure as defined in claim 30, wherein said first and second metal layers are composed of a material selected from the group consisting of doped polysilicon, W, aluminum alloys, AlCu, AlSi, AlSiCu, AlTi, AlAg, AlAu, AlMn, AlGe, AlW, AlCuGe, AlNi, and their combinations.

33. The interconnect structure as defined in claim 30, further comprising:

a third trench defined by said second dielectric layer and extending through said second dielectric layer and terminating upon a top surface of said first dielectric layer; and a third metal layer that:

extends from a top surface thereof not above the second dielectric layer, through said third trench, and terminates at a bottom surface thereof upon said top surface of said first dielectric layer;

fills the third trench; and has a constant electrical resistance from the top surface thereof to the bottom surface thereof.

\* \* \* \* \*

UNITED STATES PATENT AND TRADEMARK OFFICE
CERTIFICATE OF CORRECTION

PATENT NO. : 6,781,235 B1
DATED : August 24, 2004
INVENTOR(S) : John H. Givens

It is certified that error appears in the above-identified patent and that said Letters Patent is hereby corrected as shown below:

<u>Column 4,</u>
Line 7, after "single" change "deposition and," to -- deposition, and --
Line 52, before "dielectric" insert -- second --

<u>Column 7,</u>
Line 27, after "trench" change "an" to -- and --

Signed and Sealed this

Eighth Day of February, 2005

JON W. DUDAS
*Director of the United States Patent and Trademark Office*